United States Patent
Lee

(10) Patent No.: US 6,310,670 B1
(45) Date of Patent: Oct. 30, 2001

(54) THIN-FILM TRANSISTOR (TFT) LIQUID CRYSTAL DISPLAY (LCD) DEVICES HAVING FIELD-INDUCED LDD REGIONS

(75) Inventor: Joo-hyung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/123,035

(22) Filed: Jul. 27, 1998

(30) Foreign Application Priority Data

Jul. 28, 1997 (KR) .................................... 97-35598

(51) Int. Cl.[7] .............................. G02F 1/136; H01L 29/02
(52) U.S. Cl. ............................................... 349/43; 257/336
(58) Field of Search .................................. 349/42, 43, 44, 349/45; 257/59, 72, 336, 408, 347

(56) References Cited

U.S. PATENT DOCUMENTS

| | | | |
|---|---|---|---|
| 5,434,433 | * 7/1995 | Takasu et al. | 257/59 |
| 5,742,363 | * 4/1998 | Bae | 349/43 |
| 5,834,797 | * 11/1998 | Yamanaka | 257/72 |

OTHER PUBLICATIONS

Mutsuyo Sato, Technical Report entitled "Low–Temperature TFT LCD Manufacturing Process by Annealing and Ion Implantation", LCD Intelligence, AKT–96–61, pp. 1–6, Jul. (1996).

* cited by examiner

Primary Examiner—William L. Sikes
Assistant Examiner—Dung Nguyen
(74) Attorney, Agent, or Firm—Myers Bigel Sibley & Sajovec

(57) ABSTRACT

TFT-LCD devices include a plurality of pixels and each pixel includes a thin-film transistor (TFT) and an opaque LDD electrode which is capacitively coupled to a portion of the TFT's active layer, so that an impurity doped LDD region is not necessary and improved device characteristics can be achieved. The TFT includes a gate electrode, a channel region, a drain extension region at a first end of the channel region and a drain region of first conductivity type electrically coupled to the first end of the channel region by the drain extension region. In addition, an LDD electrode is disposed opposite the drain extension region so that during on-state operation of the TFT, a relatively high first conductivity type charge carrier concentration can be established in the drain extension region, upon application of a potential bias thereto. A transparent substrate is also provided and the LDD electrode is disposed between the transparent substrate and the drain extension region. The drain region of the TFT is also self-aligned to the LDD electrode, but is preferably not self-aligned to the gate electrode. A transparent pixel electrode is also electrically coupled to the drain region and a data line is electrically coupled to the source region. According to another embodiment of the present invention, a gate electrode insulating layer is disposed between the gate electrode and the active layer and a common electrode is disposed between the gate electrode insulating layer and the pixel electrode. The common electrode is preferably electrically connected to the LDD electrode and may even be contiguous as a single layer of material.

3 Claims, 9 Drawing Sheets

THIN-FILM TRANSISTOR (TFT) LIQUID CRYSTAL DISPLAY (LCD) DEVICES HAVING FIELD-INDUCED LDD REGIONS

FIELD OF THE INVENTION

The present invention relates to display devices and methods of forming display devices, and more particularly to liquid crystal display devices and methods of forming liquid crystal display devices.

BACKGROUND OF THE INVENTION

In order to minimize the space required by display devices, research into the development of various flat panel display devices such as LCD display devices, plasma display panels (PDP) and electro-luminescence displays (EL), has been undertaken to displace larger cathode-ray tube displays (CRT) as the most commonly used display devices. Particularly, in the case of LCD devices, liquid crystal technology has been explored because the optical characteristics of liquid crystal material can be controlled in response to changes in electric fields applied thereto. As will be understood by those skilled in the art, a thin film transistor liquid crystal display (TFT-LCD) device typically uses a thin film transistor as a switching device and the electrical-optical effect of liquid crystal molecules to display data visually.

At present, the dominant methods for fabricating LCD devices and panels are typically methods based on amorphous silicon (a-Si) thin-film transistor technologies. Using these technologies, high quality image displays of substantial size can be fabricated using low temperature processes. As will be understood by those skilled in the art, conventional LCD devices typically include a transparent (e.g., glass) substrate with an array of thin-film transistors thereon, pixel electrodes, orthogonal gate and data lines, a color filter substrate and liquid crystal material between the transparent substrate and the color filter substrate. The use of a-Si TFT technology typically also requires the use of separate peripheral integrated circuitry to drive the gates and sources (i.e., data inputs) of the TFTs in the array. In particular, gate driving signals from a gate driving integrated circuit are typically transmitted to the gate electrodes of TFTs in respective rows and data driving signals from a data driving integrated circuit are typically transmitted to the source electrodes of TFTs in respective columns. A display is typically comprised of a TFT substrate in which a plurality of liquid crystal pixels are formed. Each pixel typically has at least one TFT and a pixel electrode coupled to the drain of the respective TFT. Accordingly, the application of a gate driving signal to the gate of a TFT will electrically connect the pixel electrode of a respective TFT to the data line connected thereto.

TFTs which contain polycrystalline silicon active layers have also been considered to obtain greater carrier mobility and improve on-state current characteristics by reducing leakage currents. However, in order to form a polysilicon-based TFT-LCD having large area, more improved leakage current characteristics are necessary to facilitate increased contrast. Laser crystallization techniques may also be needed to convert amorphous silicon active layers to polycrystalline silicon active layers.

As will be understood by those skilled in the art, strong electric fields located adjacent the drain regions of TFTs typically result in high leakage currents. In order to suppress the magnitudes of these electric fields, offset gate structures, lightly doped drain (LDD) structures and multi-gate structures have been proposed. In the case of the offset gate structure or the LDD structure, steps should typically be performed to insure self-alignment of regions in order to minimize deterioration of image quality by parasitic capacitance. A conventional method of forming polysilicon-based TFT-LCD devices is described in a technical report by M. Sato, entitled "Low-Temperature TFT-LCD Manufacturing Process by Annealing and Ion Implantation", AKT News Excerpt AKT-96-61 from LCD Intelligence, Applied Komatsu Technology, Inc., July (1996). As described in this report, on-state leakage currents in TFTs may be reduced by using LDD regions. However, the addition of LDD regions typically requires the use of additional masks and increases the complexity and cost of fabricating TFT-LCD devices. Also, if misalignment in the LDD ion implantation mask is present, the length of the LDD regions formed at opposite ends of a TFT's channel region may be different.

The optimum length of the LDD regions in a TFT device is typically about 1.0 $\mu$m–1.2 $\mu$m when the device is operated at room temperature, however, when the device is operated at a temperature of about 70–85° C., the optimum length of the LDD regions is typically about 1.5 $\mu$m–2.0 $\mu$m. Referring now to FIGS. 1–3, graphs are provided which illustrated off-state current ($I_{off}$) versus length of an LDD region of a thin-film transistor, at various temperatures and drain-to-source voltages (5, 10 and 15 volts). Reference numerals $A_1$–$A_3$ in FIGS. 1–3 represent graphs of $I_{off}$ versus length for device operated at 20° C., reference numerals $B_1$–$B_3$ in FIGS. 1–3 represent graphs of $I_{off}$ versus length for device operated at 50° C., reference numerals $C_1$–$C_3$ in FIGS. 1–3 represent graphs of $I_{off}$ versus length for device operated at 60° C., reference numerals $D_1$–$D_3$ in FIGS. 1–3 represent graphs of $I_{off}$ versus length for device operated at 85° C. and reference numerals $E_1$–$E_3$ in FIGS. 1–3 represent graphs of $I_{off}$ versus length for device operated at 100° C.

As illustrated by FIGS. 1–3, the off-state current $I_{off}$ is low and relatively stable over the whole temperature range when the length of the LDD region is 1.5 $\mu$m or greater. However, as will be understood by those skilled in the art, on-state current in a TFT also decreases as the length of the LDD region increases beyond 2.0 $\mu$m. Thus, there is a tradeoff associated with increasing LDD length to decrease leakage currents and decreasing LDD length to increase on-state current.

Thus, notwithstanding prior art methods of forming TFT-LCD devices, there continues to be a need for improved methods of forming TFT-LCD devices having reduced off-state leakage currents and less dependence on photolithographic alignment accuracy, and methods which require a reduced number of masking steps.

SUMMARY OF THE INVENTION

It is therefore an object of the present invention to provide improved liquid crystal display devices and methods of forming same.

It is another object of the present invention to provide liquid crystal display devices having improved electrical characteristics at high operating temperatures and methods of forming same.

It is still another object of the present invention to provide methods of forming liquid crystal display devices which require a reduced number of photolithographically defined masking steps.

It is yet another object of the present invention to provide liquid crystal display devices having pixels therein with improved storage capacitor characteristics and methods of forming same.

These and other objects, advantages and features of the present invention are provided by improved thin-film transistor (TFT) liquid crystal display (LCD) devices. These devices comprise a plurality of pixels and each pixel comprises a thin-film transistor (TFT) and a preferred LDD electrode which is capacitively coupled to a portion of the TFT's active layer, so that an impurity doped LDD region is not necessary and improved device characteristics (e.g., reduced high temperature leakage currents) can be achieved. According to one embodiment of the present invention, a TFT includes a gate electrode, a channel region extending opposite the gate electrode, a drain extension region (e.g., undoped poly-Si) at a first end of the channel region and a drain region of first conductivity type electrically coupled to the first end of the channel region by the drain extension region. In addition, an LDD electrode is disposed opposite the drain extension region so that during on-state operation of the TFT, a relatively high first conductivity type charge carrier concentration can be established in the drain extension region, upon application of a potential bias to the LDD electrode. According to a preferred aspect of this embodiment, a transparent substrate is provided and the LDD electrode is disposed between the transparent substrate and the drain extension region. The drain region of the TFT is also self-aligned to the LDD electrode, but is preferably not self-aligned to the gate electrode. A transparent pixel electrode is also electrically coupled to the drain region and a data line is electrically coupled to the source region. A gate electrode insulating layer may also be disposed between the gate electrode and the active layer and a common electrode may be disposed between the gate electrode insulating layer and the pixel electrode. The common electrode is preferably electrically connected to the LDD electrode and may even be contiguous as a single layer of material.

According to another embodiment of the present invention, a preferred method of forming a liquid crystal display device includes the steps of forming an opaque LDD electrode on a surface of a transparent substrate and then forming a first electrically insulating layer on the LDD electrode, opposite the surface. A polycrystalline silicon active layer is formed on the first electrically insulating layer. This polycrystalline silicon active layer may be formed by recrystallizing an amorphous silicon layer using such techniques as laser annealing. A second electrically insulating layer is also formed on the polycrystalline silicon active layer, opposite the LDD electrode. Next, a layer of photoresist is formed on the second electrically insulating layer, opposite the polycrystalline silicon active layer. This photoresist layer is preferably patterned by exposing it to light (using a rear exposing method) to a develop a first region therein. Here, the LDD electrode is used as a light blocking mask. The developed first region is then removed. Next, the second electrically insulating layer is etched to define an LDD placement region and expose a portion of the polycrystalline silicon active layer. This etching step is performed using the patterned layer of photoresist as an etching mask. Source and drain region dopants are then implanted into the polycrystalline silicon active layer, using the LDD placement region as an implant mask. A gate insulating layer is then formed on the polycrystalline silicon active layer and on the LDD placement region. Next, a gate electrode is formed on the gate insulating layer and then a pixel electrode is formed and this pixel electrode is electrically coupled to the drain region. According to another aspect of this method, the step of forming a gate electrode may also comprise the step of forming a common electrode on the gate insulating layer. A step may also be performed to define a contact hole in the gate insulating layer and the first electrically insulating layer, to expose the LDD electrode. If this step is performed, then the step of forming a common electrode may comprise forming a common electrode in the contact hole, in contact with the LDD electrode.

DESCRIPTION OF PREFERRED EMBODIMENTS

Figure 1:
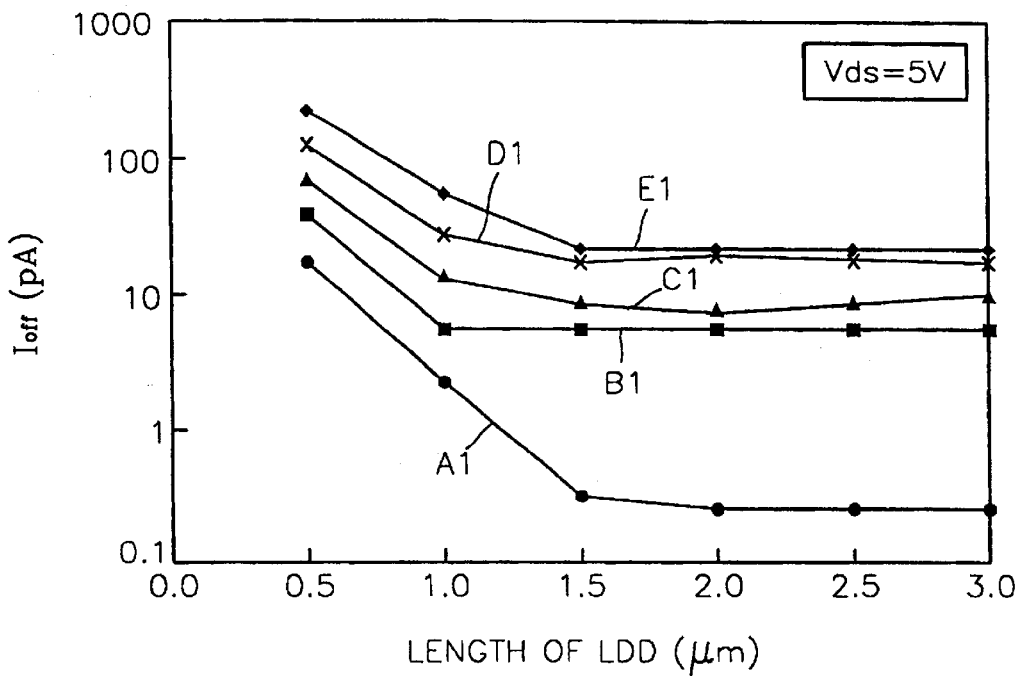
FIGS. 1–3 graphs of off-state current versus length of an LDD region of a thin-film transistor, at various temperatures and drain-to-source voltages.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Figure 4:
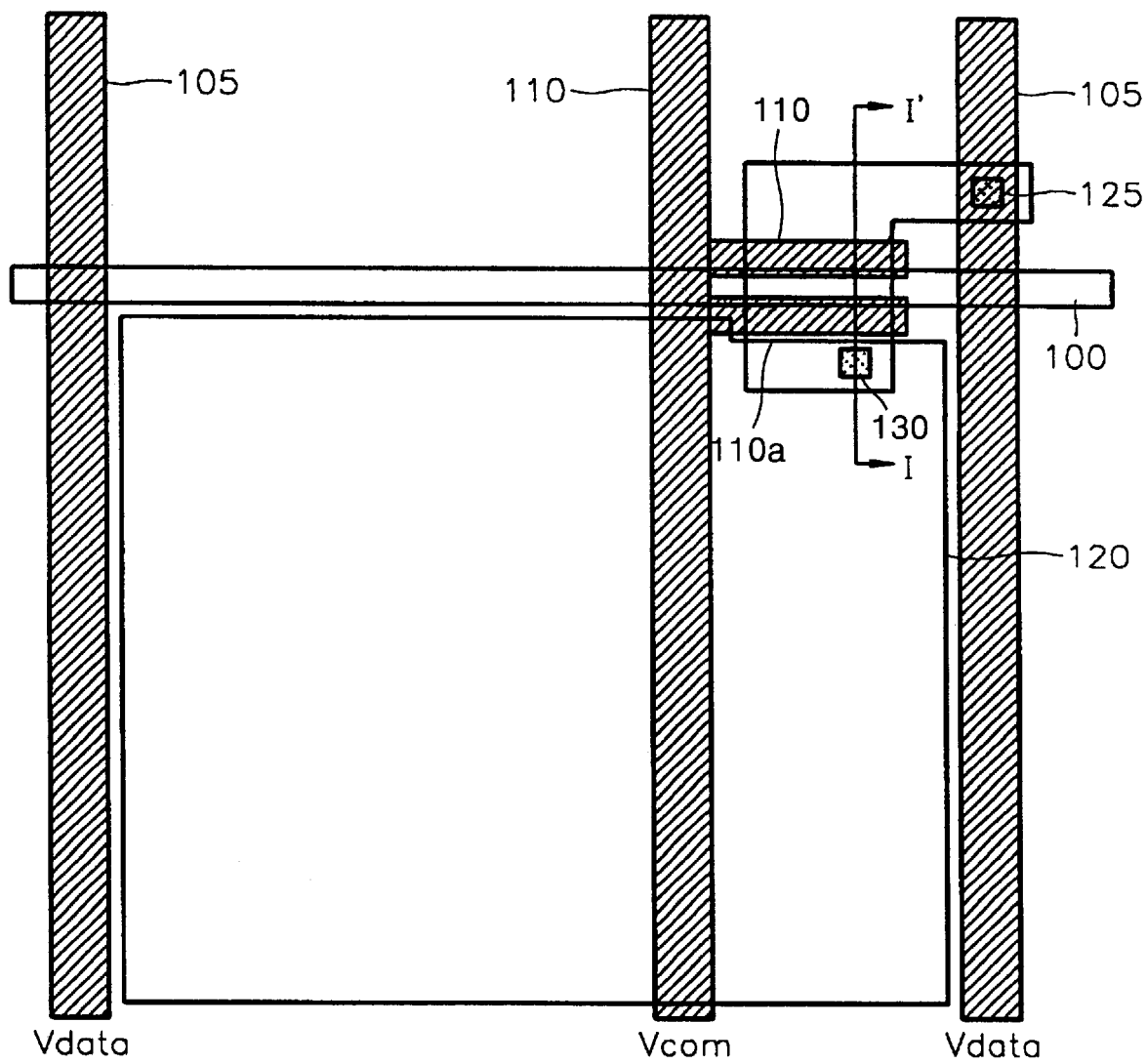
FIG. 4 is a layout schematic of a thin-film transistor (TFT) liquid crystal display (LCD) display device according to a first embodiment of the present invention.

Referring now to FIGS. 4–9, preferred methods of forming a liquid crystal display (LCD) device according to a first embodiment of the present invention will be described. In particular, FIG. 4 is a layout schematic of a thin-film transistor (TFT) LCD device according to a first embodiment of the present invention. In FIG. 4, reference numeral 100 represents a mask pattern for forming a gate line, reference numerals 105 and 110 represents mask patterns for forming a data line and a common electrode, reference numeral 115 represents a mask pattern for forming an active layer, reference numeral 120 represents a mask pattern for forming a pixel electrode, reference numeral 125 represents a mask pattern for forming a contact hole which is used to connect the data line and a source region of the active layer of the TFT, and reference numeral 130 represents a mask pattern for forming a contact hole which is used to connect the pixel electrode and a drain region of the active layer of the TFT. As will be understood by those skilled in the art, a region defined between a pair of parallel gate line patterns 100 and a corresponding pair of data line patterns 105 corresponds to a pixel of the TFT-LCD device. These reference numerals may also be used to describe an actual region defined by a mask pattern.

As illustrated by FIG. 4, the mask pattern for the gate line 100 and the mask pattern for the data line 105 are orthogonal to each other, but the mask pattern for the common electrode 110 and the mask pattern for the data line 105 are parallel to each other. Preferably, the mask pattern for the common electrode 110 and the mask pattern for the data line 105 are defined by the same mask. In addition, the mask pattern for the common electrode 110 has, for each pixel, two spaced extensions 110a (e.g., fingers) which run orthogonal to the main portion of the common electrode 110. These parallel extensions 110a are spaced by a predetermined distance which corresponds to the length of a channel region of the TFT to be formed. A portion of the mask pattern for the common electrode 110 also overlaps with the mask pattern for the pixel electrode 120. As described hereinbelow, this overlap results in the formation of a storage capacitors. The use of storage capacitor in the operation of a TFT-LCD device is more fully described in U.S. application Ser. No. 08/821,062, filed Mar. 19, 1997, entitled "Thin-Film Transistor Liquid Crystal Display Devices Having Cross-Coupled Storage Capacitors", now U.S. Pat. No. 5,888,706, assigned to the present assignee, the disclosure of which is hereby incorporated herein by reference.

Figure 2:
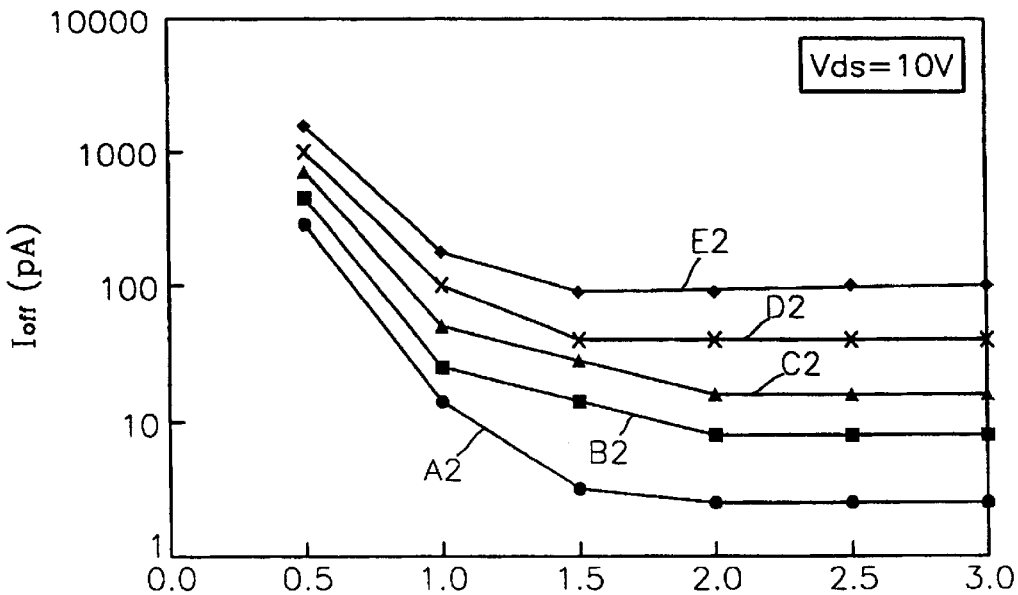
Figure 3:
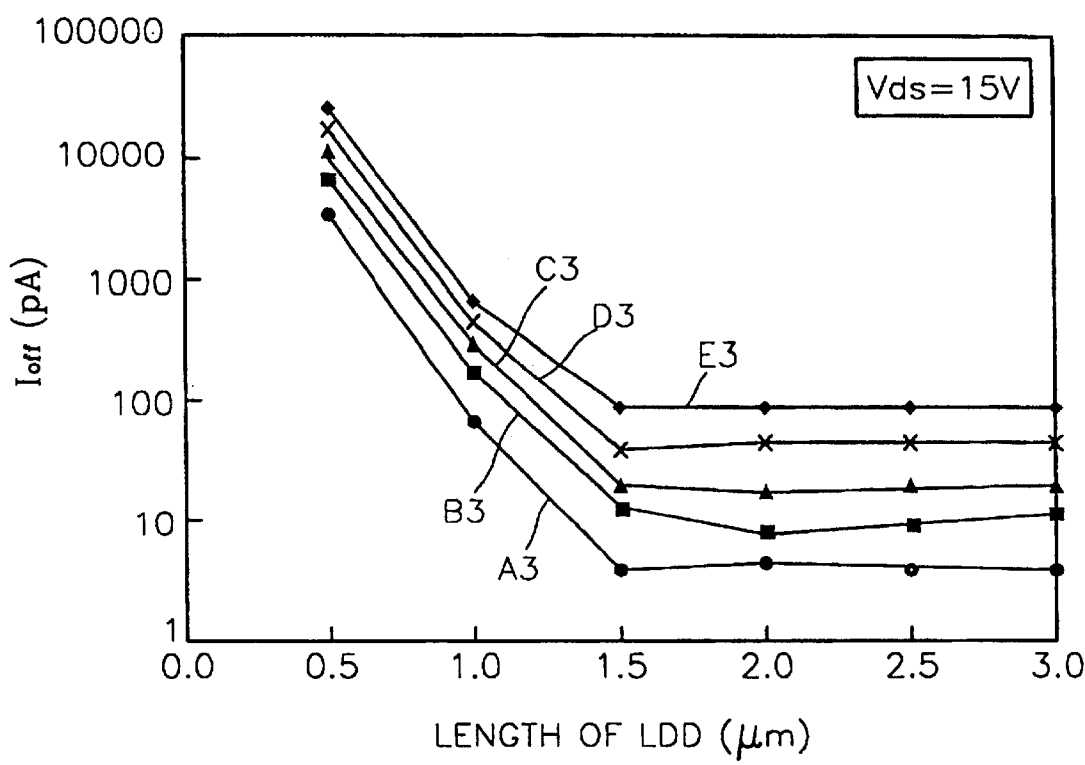
Figure 5:
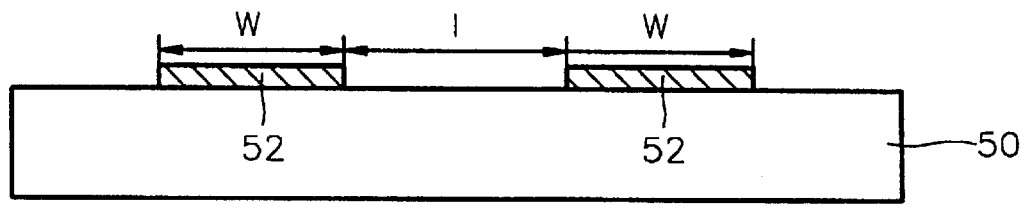
FIGS. 5–9 are cross-sectional views of intermediate structures of a TFT-LCD device according to the first embodiment of the present invention, taken line I–I' of FIG. 4.

Referring now to FIGS. 5–9, the process steps associated with methods of forming a LCD device using the mask patterns of FIG. 4 as photolithography masks, will be described. In particular, FIGS. 5–9 are cross-sectional views of intermediate structures of a TFT-LCD device according to a first embodiment of the present invention, taken along line I–I' of FIG. 4. Referring to FIG. 5, an opaque conductive layer containing a material such as chromium (Cr), is deposited on a glass substrate 50 to a thickness of about 1,500–5,000 Å. This opaque conductive layer is then photolithographically patterned using a first mask which includes the mask pattern for the common electrode 110 and the mask pattern for the data line 105, to define a data line and a common electrode having a pair of spaced extensions 52 associated with each TFT pixel. These spaced extensions 52 constitute LDD electrodes. These spaced extensions 52 also correspond to the parallel fingers 110a illustrated by FIG. 4. Here, the interval "I" between each extension 52 within a pair corresponds to the channel length of the TFT to be formed and the width "W" of each extension 52 corresponds to the length of a drain/source region extension, as explained more fully hereinbelow. Accordingly, as described above with respect to FIGS. 1–3, in order to provide the TFT-LCD with stable leakage current characteristics at operating temperatures of 70–85° C., it is preferable that the width "W" of the extensions 52 be set at 1.3–2.0 µm.

Figure 6:
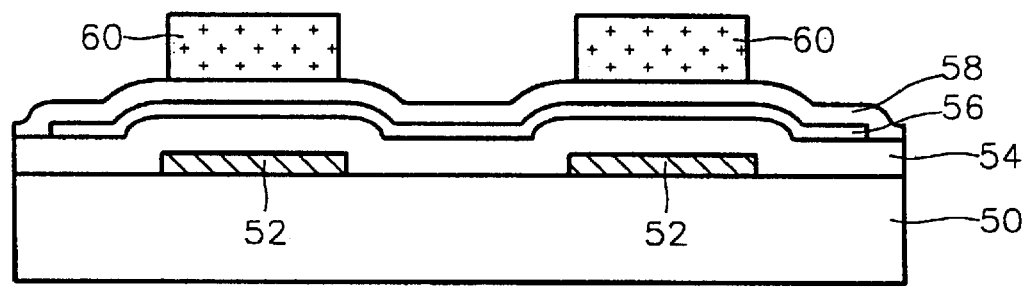

Referring now to FIG. 6, an electrically insulating material, such as an oxide (e.g., $SiO_2$), is deposited on the patterned opaque conductive layer to form a first interlayer dielectric (ILD) layer 54 having a thickness in a range between about 2,000 and 5,000 Å. The ILD layer 54 is then patterned using a second photolithography step and the contact hole mask pattern 125 as an etching mask. This patterning step is performed in order to define a contact hole and expose a portion of the data line 105. Thereafter, an amorphous silicon layer (a-Si) is deposited on the entire surface of the ILD layer 54 using a technique such as plasma enhanced chemical vapor deposition (PECVD), for example. The amorphous silicon layer may be deposited to have a thickness in a range between about 500 and 1,500 Å and may extend into the contact hole to contact the data line 105. Next, the amorphous silicon layer is crystallized as a polycrystalline silicon layer 56 by irradiating the amorphous silicon layer with pulsed laser energy (i.e., laser annealing). The polycrystalline silicon layer 56 is then patterned using a photolithographically defined etching step and the active layer mask pattern 115 as an etching mask.

Thereafter, a second electrically insulating layer 58 (e.g., oxide, nitride) is deposited on the patterned polycrystalline silicon layer 56 and on the patterned ILD layer 54. The second electrically insulating layer 58 may be deposited to a thickness in a range between about 2,000 and 4,000 Å. A layer of photoresist material is then deposited on the second electrically insulating layer 58. The layer of photoresist material is then photolithographically patterned using the patterned opaque conductive layer as a mask, to define a photoresist pattern 60 which is self-aligned to the spaced extensions 52. The patterned opaque conductive layer may be used as a mask by exposing the layer of photoresist material to light which is irradiated onto a rear surface of the transparent substrate 50. This technique is typically referred to as a rear exposing method. This rear exposing method is preferably performed so that "upper" layers or regions can be formed in a self-aligned manner to "lower" layers or regions which have already been formed.

Figure 7:
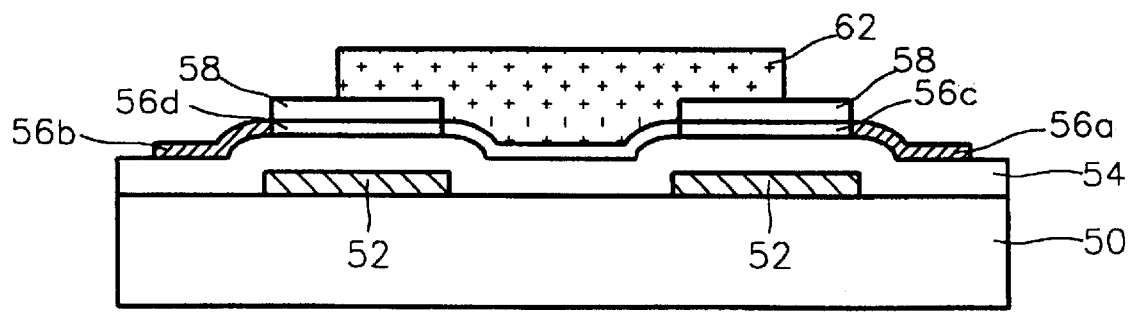

Referring now to FIG. 7, the second electrically insulating layer 58 is then photolithographically patterned by etching the electrically insulating layer 58 using the photoresist pattern 60 as an etching mask. This etching step is performed until the patterned polycrystalline silicon layer 56 is exposed. Based on this sequence of steps, the patterned electrically insulating layer 58 is also self-aligned to the patterned opaque conductive layer. The photoresist pattern 60 is then removed. Another photoresist pattern 62 is then formed on an exposed portion of the patterned polycrystalline silicon layer 56 and on the patterned second electrically insulating layer 58, as illustrated. Dopants of first conductivity type (e.g., N-type) are then implanted into the remaining exposed portions of the patterned polycrystalline silicon layer 56, to define a highly doped source region 56a and a highly doped drain region 56b of a TFT device. This dopant implant step is performed using the patterned second electrically insulating layer 58 and the photoresist pattern 62 as an implant mask. According to a preferred aspect of the present invention, it is not necessary to perform a separate LDD implant into the source and drain extension regions 56c and 56d (which extend opposite the patterned second electrically insulating layer 58) to provide a high level of free charge carriers therein. This is because the application of a predetermined potential to the spaced extensions 52 (i.e., LDD electrode) will induce additional charge carriers into the extensions 56c and 56d and make these regions appear more highly doped. Stated another way, the spaced extensions 52 act as a fourth terminal of a TFT (in addition to the gate, source and drain), and this fourth terminal may be used to modulate the conductivity of the drain and source region extensions 56c and 56d.

Figure 8:
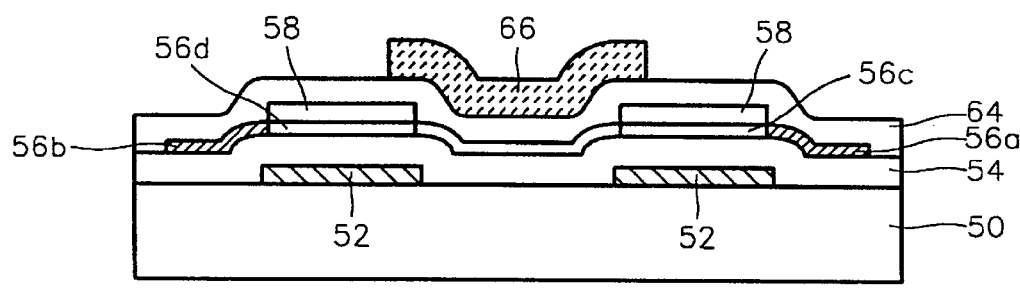

Referring now to FIG. 8, an electrically insulating material (e.g., SiO$_2$) is then deposited as a gate insulating layer 64 having a thickness in a range between about 1,000 and 1,500 Å. Then, an electrically conductive layer (e.g., aluminum) is formed on the gate insulating layer 64 and patterned using a mask (e.g., gate line pattern 100), to define a gate electrode 66 which extends opposite a channel portion of the patterned polycrystalline silicon layer 56 (i.e., active region). According to a preferred aspect of the present invention, any misalignment of the gate electrode 66 relative to the channel region will not influence the length of the drain and source extension regions 56d and 56c because these regions are not formed in a self-aligned manner relative to the gate electrode 66, but are formed in a self-aligned manner before the gate electrode 66 is formed. Thus, preferred electrical characteristics can be achieved even if misalignment of the gate electrode 66 is present. Furthermore, because a relatively thick electrically insulating region (including the ILD layer 54, the patterned second electrically insulating layer 58 and the gate insulating layer 64) is formed between the spaced extensions 52 and the gate electrode 66, any parasitic capacitance between overlapping portions of the gate electrode 66 and the spaced extensions 52 should be negligible.

Figure 9:
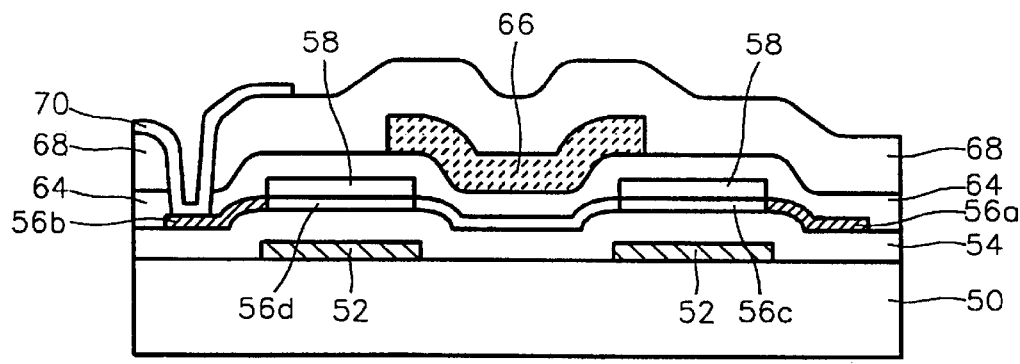

Referring now to FIG. 9, an electrically insulating passivation layer 68 comprising a material such as oxide or nitride is deposited on the structure of FIG. 8 to a thickness of about 1,000–4,000 Å. The passivation layer 68 and gate insulating layer 64 are then etched using the mask pattern 130 illustrated by FIG. 4, to define a contact hole which exposes a portion of the drain region 56b. Thereafter, a transparent conductive layer (e.g., indium tin oxide (ITO)), is formed on the passivation layer 68 and in the contact hole and then patterned using the pixel electrode mask 120, to define a pixel electrode 70. As illustrated best by FIG. 4, this pixel electrode 70 defines a storage capacitor with an overlapping portion of the patterned opaque conductive layer (e.g., common electrode 110 in FIG. 4). Thus, an extra conventional ion implantation step or metal layer deposition step is not necessary to define a storage capacitor electrode.

Figure 10:
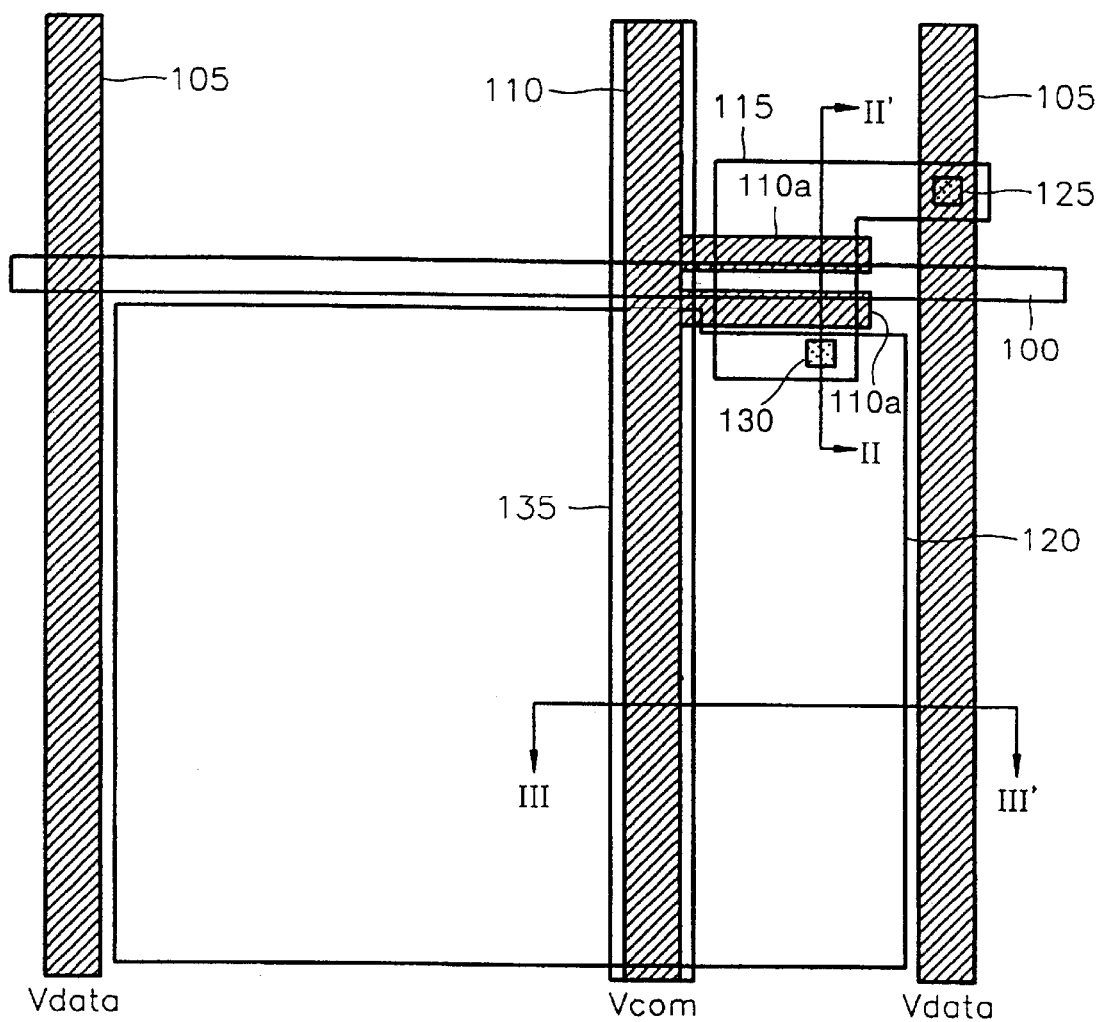
FIG. 10 is a layout schematic of a TFT-LCD device according to a second embodiment of the present invention.
Figure 11:
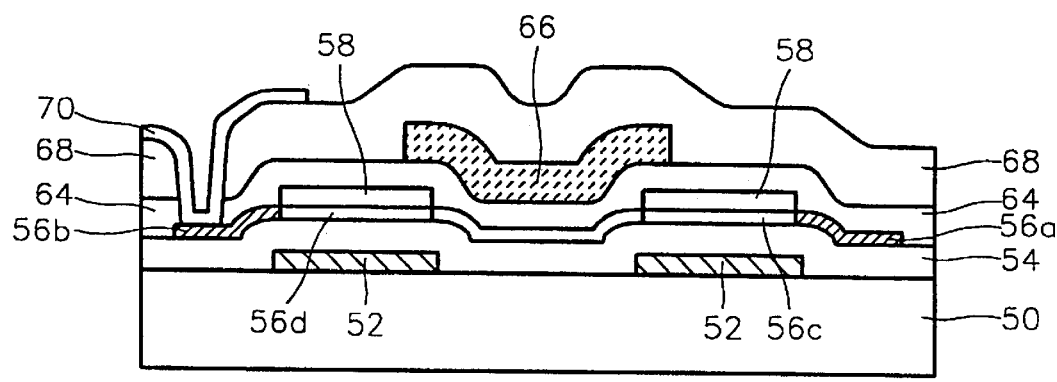
FIG. 11 is a cross-sectional view of an intermediate structure of a TFT-LCD device according to the second embodiment of the present invention, taken along line II–II' of FIG. 10
Figure 12:
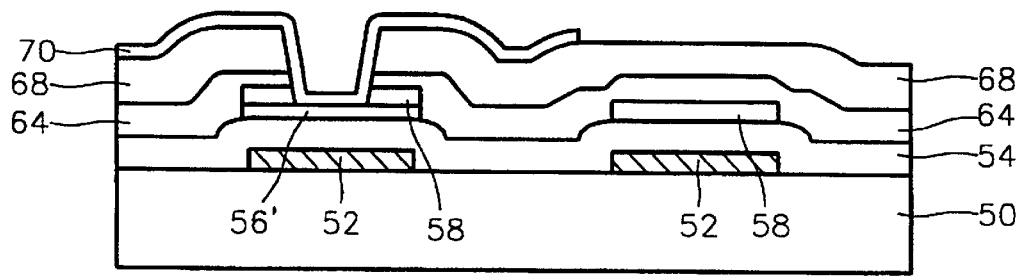
FIG. 12 is a cross-sectional view of an intermediate structure of a TFT-LCD device according to the second embodiment of the present invention, taken along line III–III' of FIG. 10.

Referring now to FIGS. 10–12, preferred methods of forming an LCD device according to a second embodiment of the present invention will be described. This second embodiment of the present invention is similar to the first embodiment, however, a storage capacitor having a larger capacitance is provided by reducing the spacing between a portion of the pixel electrode 70 and the patterned opaque conductive layer (e.g., common electrode 110 in FIG. 10). in particular, FIG. 10 is a layout schematic of a TFT-LCD display device according to a second embodiment of the present invention. This layout schematic is similar to the layout schematic of FIG. 4, however, a mask pattern 135 is also provided. Preferably, this mask pattern 135 and the mask pattern for forming the active layer 115 are defined by the same mask. Referring now to FIG. 11, a cross-sectional view of an intermediate structure of a TFT-LCD device according to the second embodiment of the present invention, taken along line II–II' of FIG. 10, is provided. This intermediate structure is the same as the intermediate structure of FIG. 9.

Referring now to FIG. 12, a cross-sectional view of an intermediate structure of a TFT-LCD device according to the second embodiment of the present invention, taken along line III–III' of FIG. 10, is provided. As will be understood by those skilled in the art, the inclusion of an additional mask pattern 135 when patterning the polycrystalline silicon layer 56 results in the formation of a polycrystalline silicon stripe 56'. This stripe 56' may be left as an undoped stripe by patterning the second electrically insulating layer 58 to cover the stripe, as illustrated. During subsequent processing, the passivation layer 68, the gate insulating layer 64 and the patterned second electrically insulating layer 58 are etched using an extension (not shown) of the mask pattern 130 illustrated by FIG. 10, to expose the polycrystalline silicon stripe 56'. Thereafter, formation of the pixel electrode 70 results in the formation of a contact to the drain region 56b of the TFT and a contact to the polycrystalline silicon stripe 56'.

Figure 13:
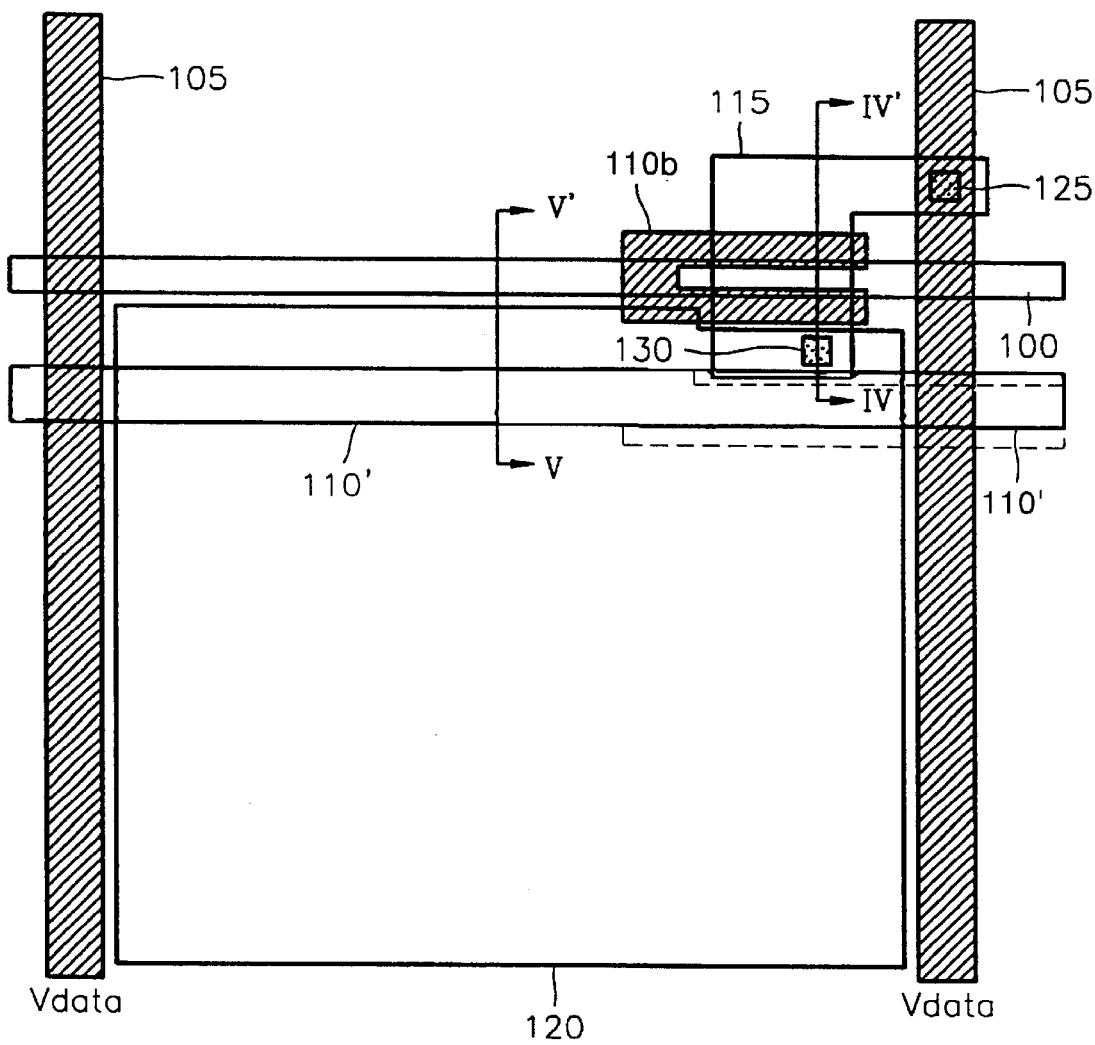
FIG. 13 is a layout schematic of a TFT-LCD device according to a third embodiment of the present invention.
Figure 14:
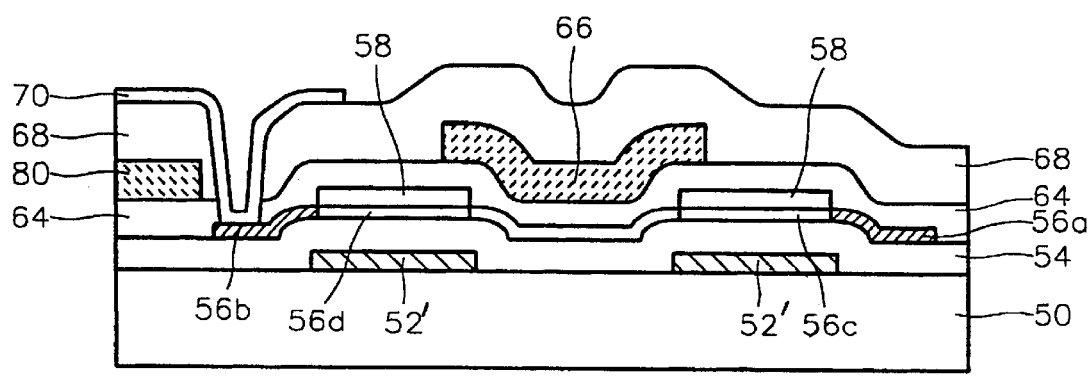
FIG. 14 is a cross-sectional view of an intermediate structure of a TFT-LCD device according to the third embodiment of the present invention, taken along line IV–IV' of FIG. 13.
Figure 15:
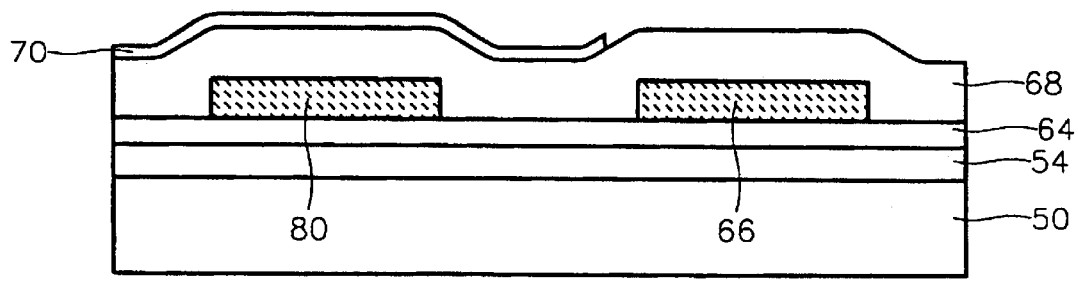
FIG. 15 is a cross-sectional view of an intermediate structure of a TFT-LCD device according to the third embodiment, taken along line V–V' of FIG. 13.

Referring now to FIGS. 13–15, preferred methods of forming an LCD device according to a third embodiment of the present invention will be described. In particular, FIG. 13 is a layout schematic of a TFT-LCD device according to the third embodiment, FIG. 14 is a cross-sectional view of an intermediate structure of a TFT-LCD device according to the third embodiment, taken along line IV–IV' of FIG. 13 and FIG. 15 is a cross-sectional view of an intermediate structure of a TFT-LCD device according to the third embodiment, taken along line V–V' of FIG. 13. This third embodiment is similar to the first embodiment, however, the mask pattern for the common electrode 110 has been eliminated and replaced by an alternative mask pattern 110'. This alternative mask pattern 110' is preferably part of the same mask which defines the mask pattern for forming the gate line 100. In addition, the pattern for the spaced extensions 10a of FIG. 4 are replaced by a U-shaped mask pattern 10b, as illustrated, so that spaced extensions 52' (i.e., an LDD electrode) can still be formed. Using the same method steps as described with respect to FIGS. 5–9, these alternative mask patterns can be used to define a common electrode 80 at the same level as the gate electrode 66. Thus, the spacing between the common electrode 80 and pixel electrode 70 can be reduced even further to increase the capacitance of each pixel's storage capacitor. Steps can also be performed during processing to electrically connect the spaced extensions 52' to the common electrode 80 via a contact hole. The mask pattern 110' may also be provided as illustrated by the dotted lines of FIG. 13 to avoid overlap between the common electrode 80 and the patterned polycrystalline silicon layer 56.

Thus, in accordance with the present invention, the spaced extensions 110a of FIGS. 4 and 10 or the U-shaped mask pattern 110b of FIG. 13 can be used to define conductive extensions 52 and 52' which act as respective LDD electrodes. These extensions eliminate the need for doped LDD regions between the channel region and the source and drain regions of a pixel's TFT. Eliminating the need for doped LDD regions also enhances the leakage current characteristics of a TFT and facilitates the formation of TFT-LCD devices which can operate at high temperatures in a range between about 70–85° C. Moreover, any misalignment associated with the gate electrode does not contribute to misalignment of the source and drain extension regions 56c and 56d and has reduced influence on TFT characteristics. Fewer masking steps are also required when methods of the present invention used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A thin-film transistor liquid crystal display device, comprising;

transparent substrate;

an opaque LDD electrode on a surface of said substrate;

a first electrically insulating layer on said opaque LDD electrode;

a polycrystalline silicon active layer on said first electrically insulating layer, opposite said opaque LDD electrode;

an electrically insulating LDD placement region on said active layer, said LDD placement region extending opposite said opaque LDD electrode and self-aligned thereto;

a gate insulating layer on said active layer;

a gate electrode on said gate insulating layer, opposite said active layer;

drain and source regions of first conductivity type in said active layer;

a pixel electrode electrically connected to said drain region; and a common electrode which extends opposite said pixel electrode and is electrically coupled to said opaque LDD electrode.

2. The display device of claim 1, wherein said common electrode and said opaque LDD electrode are contiguous.

3. The display device of claim 1, wherein said common electrode is disposed on said gate insulating layer.

* * * * *